United States Patent
Dirks et al.

(10) Patent No.: US 7,191,424 B2
(45) Date of Patent: Mar. 13, 2007

(54) SPECIAL TIE-HIGH/LOW CELLS FOR SINGLE METAL LAYER ROUTE CHANGES

(75) Inventors: Juergen Dirks, Holzkirchen (DE); Norbert Mueller, Munich (DE); Ralf Leuchter, Munich (DE)

(73) Assignee: LSI Logic Corporation, Milpitas, CA (US)

( * ) Notice: Subject to any disclaimer, the term of this patent is extended or adjusted under 35 U.S.C. 154(b) by 217 days.

(21) Appl. No.: 10/929,218

(22) Filed: Aug. 30, 2004

(65) Prior Publication Data
US 2006/0048079 A1 Mar. 2, 2006

(51) Int. Cl.
*G06F 17/50* (2006.01)
(52) U.S. Cl. ...................................................... 716/12
(58) Field of Classification Search ............. 716/12–14
See application file for complete search history.

(56) References Cited

U.S. PATENT DOCUMENTS

| | | | |
|---|---|---|---|
| 6,075,934 A * | 6/2000 | Chiluvuri et al. ............. | 716/10 |
| 6,336,207 B2 * | 1/2002 | Shinomiya et al. ........... | 716/11 |
| 6,598,206 B2 * | 7/2003 | Darden et al. ................. | 716/2 |
| 6,684,377 B2 * | 1/2004 | Barney et al. ................. | 716/10 |
| 6,701,509 B2 * | 3/2004 | Aggarwal et al. ............. | 716/13 |
| 7,003,748 B1 * | 2/2006 | Hsu ................................ | 716/8 |
| 7,076,756 B2 * | 7/2006 | Ichimiya ....................... | 716/10 |
| 2005/0229133 A1 * | 10/2005 | Goto et al. .................... | 716/10 |

* cited by examiner

*Primary Examiner*—Stacy A Whitmore
(74) *Attorney, Agent, or Firm*—Christopher P. Maiorana, P.C.

(57) ABSTRACT

A method for implementing a circuit design is disclosed. The method generally includes the steps of identifying, replacing and routing. The first step may identify a first cell of the circuit design having (i) a function and (ii) an input pin connectable to one of a first power rail and a second power rail having a different voltage than the first power rail. The second step may replace the first cell with a second cell having (i) the function, (ii) the input pin and (iii) at least one blocking characteristic that reserves (a) a first route completely within a particular conductive layer of the cell between the input pin and the first power rail and (b) a second route completely within the particular conductive layer between the input pin and the second power rail. The third step may route the circuit design incorporating the second cell such that the input pin is connected to one of (i) the first power rail using the first route and (ii) the second power rail using the second route.

23 Claims, 5 Drawing Sheets

SPECIAL TIE-HIGH/LOW CELLS FOR SINGLE METAL LAYER ROUTE CHANGES

FIELD OF THE INVENTION

The present invention relates to circuit design layout generally and, more particularly, to a method and special tie-high/tie-low cells for single metal layer route changes.

BACKGROUND OF THE INVENTION

In portions of a conventional application specific integrated circuit (ASIC), Platform ASIC, other field programmable gate array (FPGA) or like designs, one to several input gates within the designs are tied to fixed values of logical zero (i.e., ground or VSS) or logical one (i.e., power or VDD). An example application for fixing gate inputs is a Joint Test Action Group (JTAG) identification (ID) number, as illustrated in FIG. 1. The example illustrates a JTAG ID register number (3:0) of binary "0010".

Very late in a design flow, or even after a design is taped out and prototypes have been tested in context with the intended systems, small bugs are commonly found in the design. Enhancements are also commonly planned for the design. Appropriate methodologies are available today to implement the bug fixes and the enhancements. However, changes to the design are difficult to implement with only minor changes to the layout.

Even if corrections and real functional enhancements can be achieved with changes in only a single metal layer, changing tied gate inputs, like the JTAG ID, can easily result in changes to multiple metal layers. For example, swapping a route for a gate input from VDD or VSS to an opposite value can be blocked by the routing of other signals. Therefore, an effort to reduce functional changes to a minimum number of metal layers is often wasted because reversing tied-high and tied-low gate inputs can result in changing many metal layers.

Currently the cost of having to implement a change, which could be done in a single metal layer, is the cost of changing several metal layers to account for tie-high/tie-low changes. No solution is currently in place that could guarantee that changes for tied-high and tied-low gates can be implemented in a single metal layer. The cost of a change in each additional metal layer in small geometry technologies becomes more unacceptable.

SUMMARY OF THE INVENTION

The present invention concerns a method for implementing a circuit design. The method generally comprises the steps of identifying, replacing and routing. The first step may identify a first cell of the circuit design having (i) a function and (ii) an input pin connectable to one of a first power rail and a second power rail having a different voltage than the first power rail. The second step may replace the first cell with a second cell having (i) the function, (ii) the input pin and (iii) at least one blocking characteristic that reserves (a) a first route completely within a particular conductive layer of the cell between the input pin and the first power rail and (b) a second route completely within the particular conductive layer between the input pin and the second power rail. The third step may route the circuit design incorporating the second cell such that the input pin is connected to one of (i) the first power rail using the first route or (ii) the second power rail using the second route, according to the circuit's functionality.

The objects, features and advantages of the present invention include providing a method and/or special circuit library cells that may (i) guarantee that input pins may be directly tied to a logical one or a logical zero completely within a single conductive layer, (ii) reduce a number of conductive layers that have to be changed to a minimum, (iii) avoid blocking routing areas where a tie-high/tie-low option is absent, (iv) reduce a number of vias in a design and/or (v) increase a fabrication yield.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
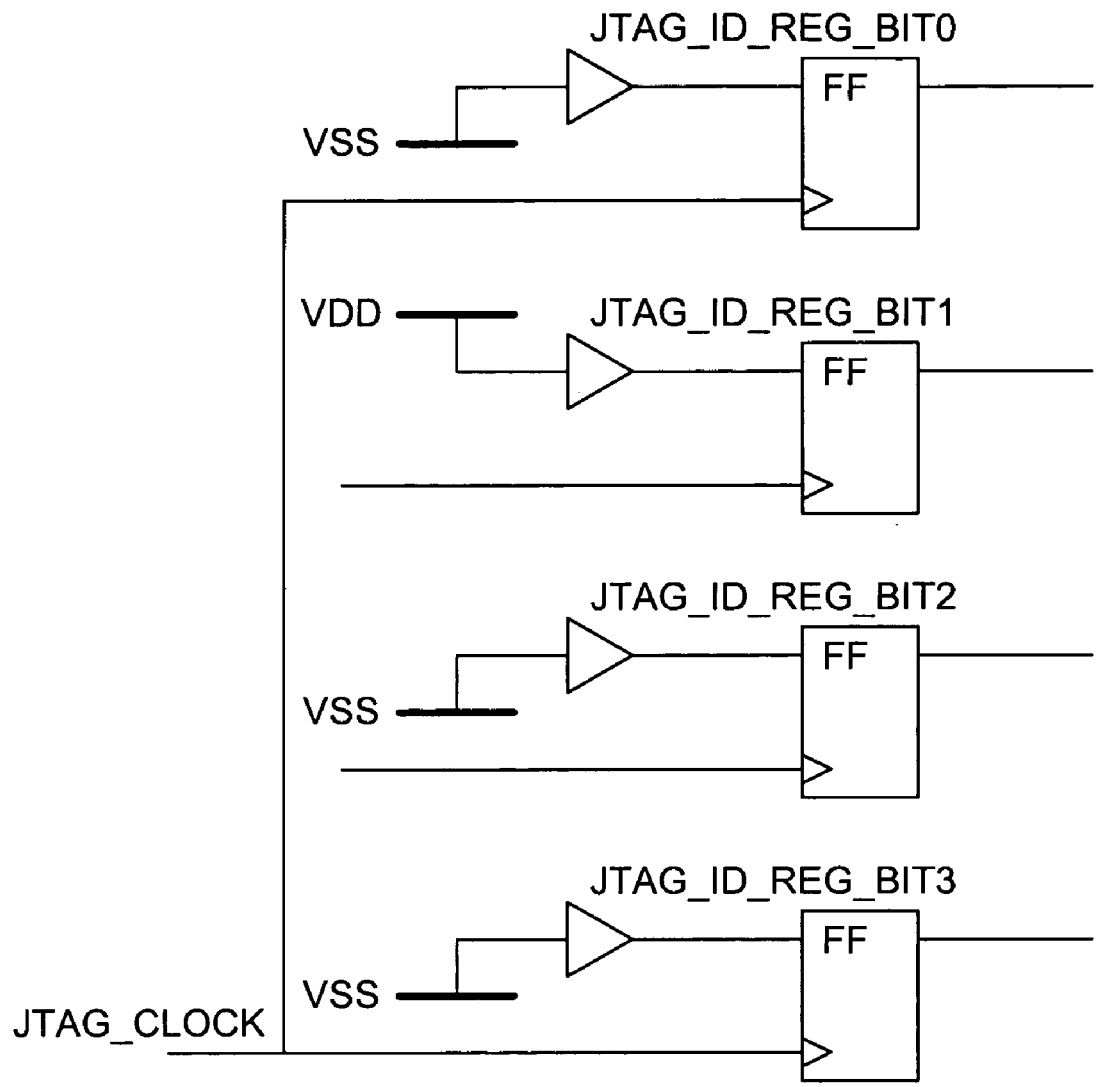
FIG. 1 is a block diagram of a conventional JTAG identification value implementation.
Figure 2:
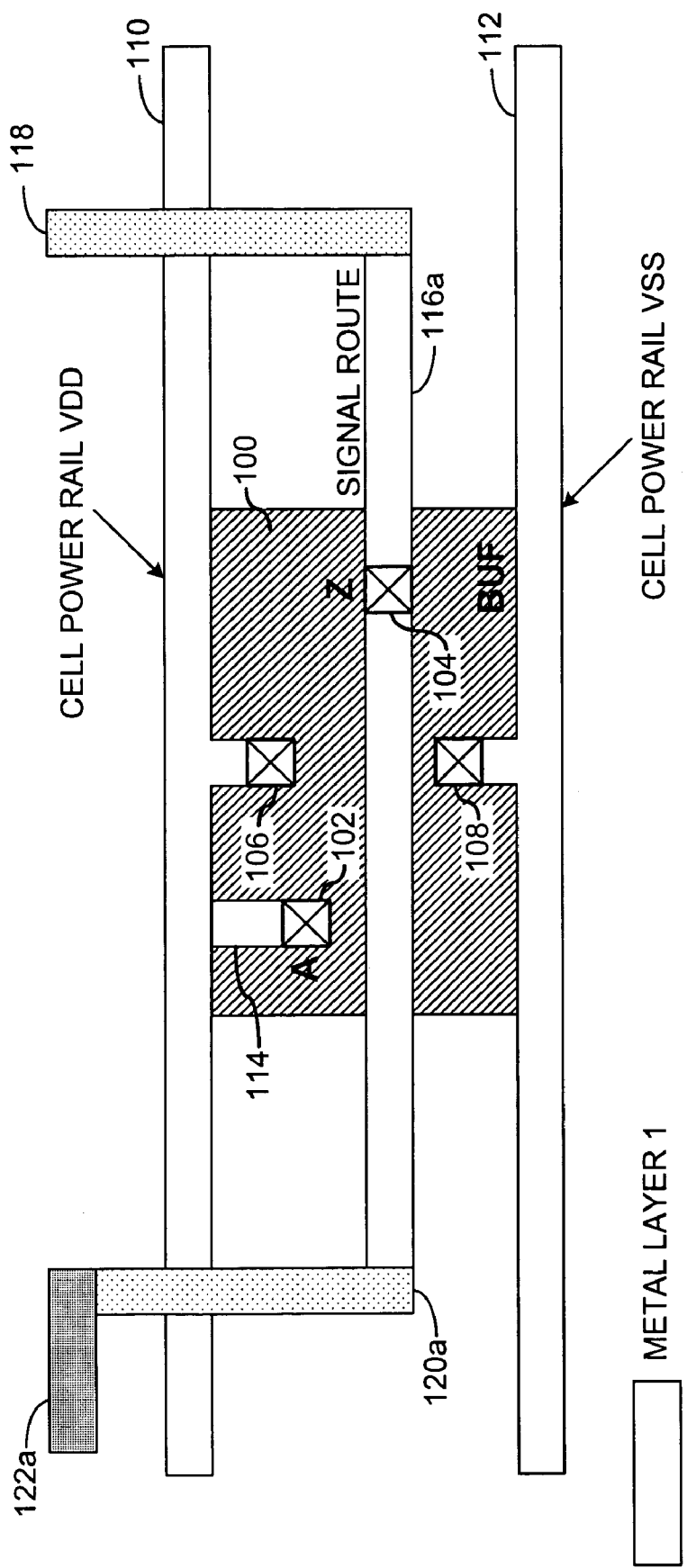
FIG. 2 is a block diagram of an example layout of a conventional standard circuit.

Referring to FIG. 2, a block diagram of an example layout of a standard circuit 100 is shown. The circuit 100 may be referred to as a standard cell. The standard cell 100 generally comprises an input pin 102, an output pin 104, a first power pin 106 and a second power pin 108. An input signal (e.g., A) may be received at the input pin 102. An output signal (e.g., Z) may be presented at the output pin 104. The standard cell 100 may be operational to generate the output signal Z in response to the input signal A (e.g., Z=f(A)). For example, the standard cell 100 may implement a non-inverting buffer (BUF) function (e.g., Z=1*A). Other functions, a different number of inputs and a different number of outputs may be implemented to meet the criteria of a particular application.

Routing of the standard cell 100 generally comprises routing the power pin 106 to a first power rail 110 (e.g., power or VDD) and routing the power pin 108 to a second power rail 112 (e.g., ground or VSS). The first power rail 110 and the second power rail 112 may be formed in a single conductive layer (e.g., a metal layer 1) used by the standard cell 100. The first power rail 110 generally carries a voltage defining a logical one for the standard cell 100. The second power rail 112 generally carries a voltage defining a logical zero for the standard cell 100. In one implementation, the first power rail 110 may define the logical zero value and the second power rail 112 may define the logical one value.

A routing procedure may connect the input pin 102 directly to one of the first power rail 110 (shown) or the second power rail 112 using a trace 114. The output signal Z may be carried on a trace 116*a*. Routing of the output signal Z may be implemented in at least the same conductive layer (e.g., metal layer 1) as routing of the input signal A. The signal Z may also be routed within other conductive layers, such as a metal layer 2 (e.g., traces 118 and 120a) and a metal layer 3 (e.g., trace 122a).

Generally, reconnecting a gate input from VDD to VSS or vice versa, which sounds very simple, may be problematic if other signals are routed between the affected input pin and the power rails. For example, the trace 116a may interfere with rerouting input pin 102 from the first power rail 110 to the second power rail 112. Initial routing of the trace 116a may result in additional metal layers and additional traces being changed to establish a path between the input pin 102 and the second power rail 112. The input pin 102 of the cell 100 may be originally connected to VDD using only the metal layer 1 for routing. The route for the output signal Z, also in the metal layer 1, does not allow a direct connection of input pin 102 to VSS. Either (i) the traces 116a, 120a and 122a may be modified to route to the right and top of input pin 102 or the connection between the input pin 102 and the second power rail 112 may be routed onto the metal layer 2 and/or metal layer 3 to cross the trace 116a.

The present invention describes a new cell type (such as a simple buffer) having a special characteristic to avoid the above rerouting problem. The present invention may add a route blockage characteristic in the same metal or other conductive layer that carries the standard cell power rails for VDD and VSS and the pin of interest. The metal layer is usually, but not limited to, a lowest metal layer (closest to the semiconductor substrate). The blockage characteristic is generally located between the input pin 102 and the power rails 110 and 112 for VDD and VSS on both sides of the cell in a particular metal layer. Therefore, routing channels from the input pin 102 to both VDD and VSS may remain unblocked by any other signal route in the particular metal layer. The present invention may guarantee that swapping a connection from VDD to VSS or vice versa may always be achieved in a single metal layer change. For example, a swap of the connection of the input pin 102 from VDD to VSS may be easily achieved with just a change in metal layer 1 routing. By reducing the metal layer changes for the routes to power and ground to tied cell inputs, a number of vias in a circuit design may be reduced compared with conventional techniques. Reducing the number of vias may lead to a higher yield because vias are often candidates for silicon failures.

Figure 3:
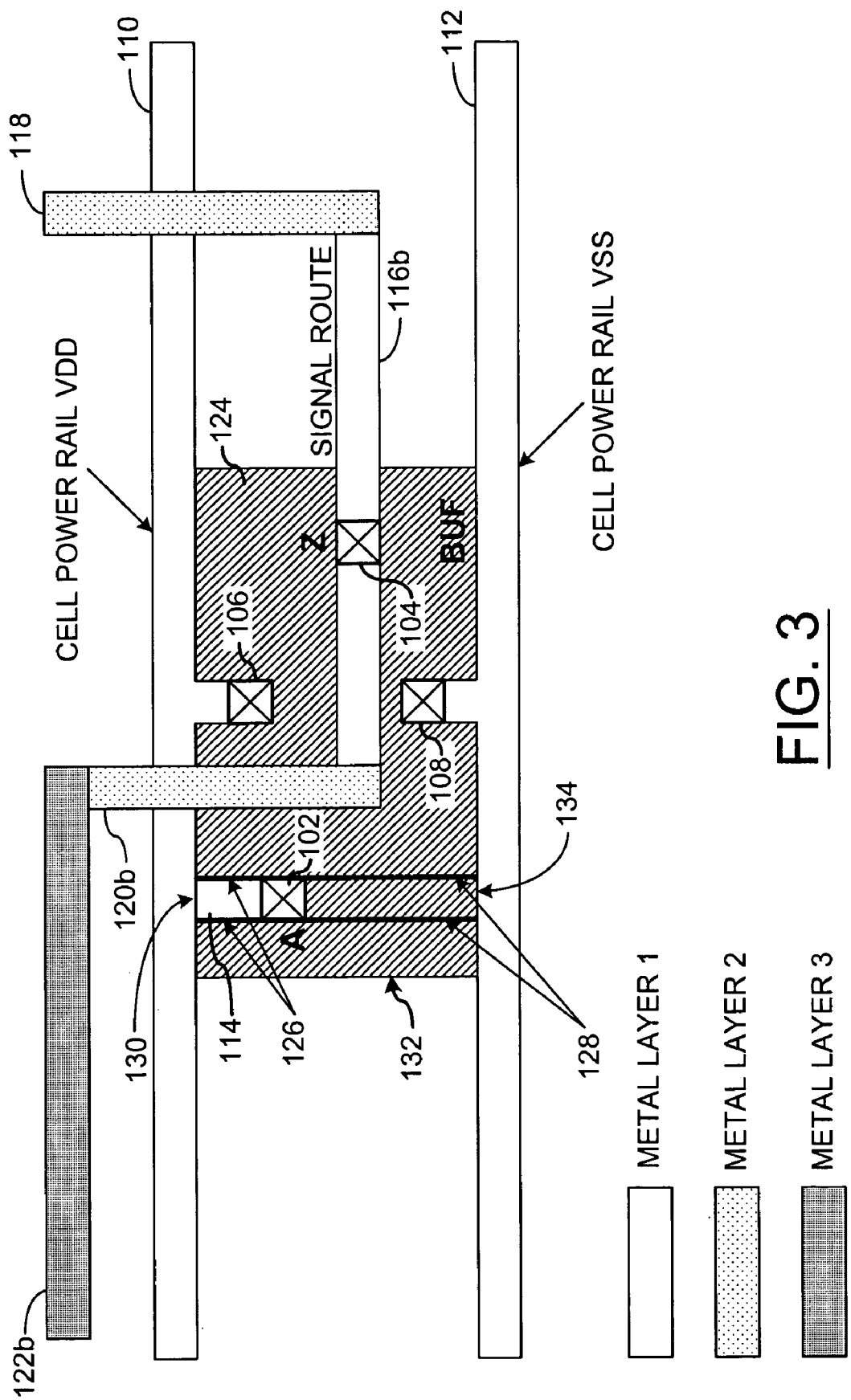
FIG. 3 is a block diagram of an example layout of a special circuit in accordance with a preferred embodiment of the present invention.

Referring to FIG. 3, a block diagram of an example layout of a special circuit 124 is shown in accordance with a preferred embodiment of the present invention. The circuit 124 may be referred to a special cell. The special cell 124 may have a same layout and functionality as the standard cell 100. The special cell 124 may be operational to generate the output signal Z in response to the input signal A (e.g., Z=f(A)). For example, the special cell 124 may implement a non-inverting buffer function (e.g., Z=1*A), same as the standard cell 100. Other functions (e.g., NOR, flip-flop, latch, inverter, etc.), different number of inputs and a different number of outputs may be implemented to meet the criteria of a particular application.

The special cell 124 generally comprises the input pin 102, the output pin 104, the first power pin 106 and the second power pin 108. The special cell 124 may include one or more characteristics (or attributes) not present in the standard cell 100. The special cell 124 may include a blocking characteristic associated with the input pin 102 not found in the standard cell 100.

The blocking characteristics may include a first reserved route 126 and a second reserved route 128. The first reserved route 126 may reserve an area (or path) between the input pin 102 and a location 130 on a boundary 132 of the special cell 124. The second reserved route 128 may reserve an area (or path) between the input pin 102 and a location 134 on the boundary 132. The location 130 may provide a predetermined position to connect the first power rail 110 and the trace 114 to drive the input signal A to the logical high level. The location 134 may provide a predetermined position to connect the second power rail 112 to a trace (not shown) to drive the input signal A to the logical low level.

The second reserved route 128 may alter how an automatic routing tool implements the traces connected to the output pin 104. For example, a trace 120b may be shifted to the right relative to the similar trace 120a (FIG. 2) Therefore, a trace 116b may be shorter to the left of the output pin 104 than the similar trace 116a (FIG. 2). A trace 122b may be longer than the similar trace 122a (FIG. 2). The first reserved route 126 may prevent the automatic routing tool from placing the trace 122b between the input pin 102 and the first power rail 110 where the input pin 102 was originally connected to the second power rail 112.

In order not to introduce too many routing blockages to the circuit design layout, the special cell 124 may be used in place of the standard cells 100 only in portions of a circuit design having gate inputs permanently fixed to receive either the logical one value or the logical zero value. Other instantiations of the standard cell 100 may remain unchanged to avoid unnecessarily introducing blocked areas.

The new special cell 124, and other similar special cells, may be added to technology libraries, and are generally used in the special cases where gate inputs should be connected to the logical zero voltages and/or logical one voltages. Each of the special cells generally contains routing blockages in the area between one or more input pins that may be driven to VDD or VSS by the power and the ground rails. The routing blockages may be implemented in the metal layer that would normally be used to connect to power and ground.

Since the routing blockages may be part of the special cells, other signal routes may never be placed in the areas between the input pin and the power and the ground rails. Therefore a change of the connection of the input signals from VDD to VSS or vice versa, may always be possible with a single metal layer change. The single layer change generally guarantees that once a single metal layer change is found for the functional enhancements of a design, the complete change may be implemented with a low cost compare with conventional approaches.

In current designs, where either the special cells are not available or automatic routing tools do not recognize the blocking characteristics, scripts may be used to generate the routing blockages for cells and the input pins, which may be identified to be potential ID numbers or similar tied gates, and which may be potential candidates for a change of connection from VDD to VSS, or vice versa, once a re-spin of the circuit design is performed.

Figure 4:
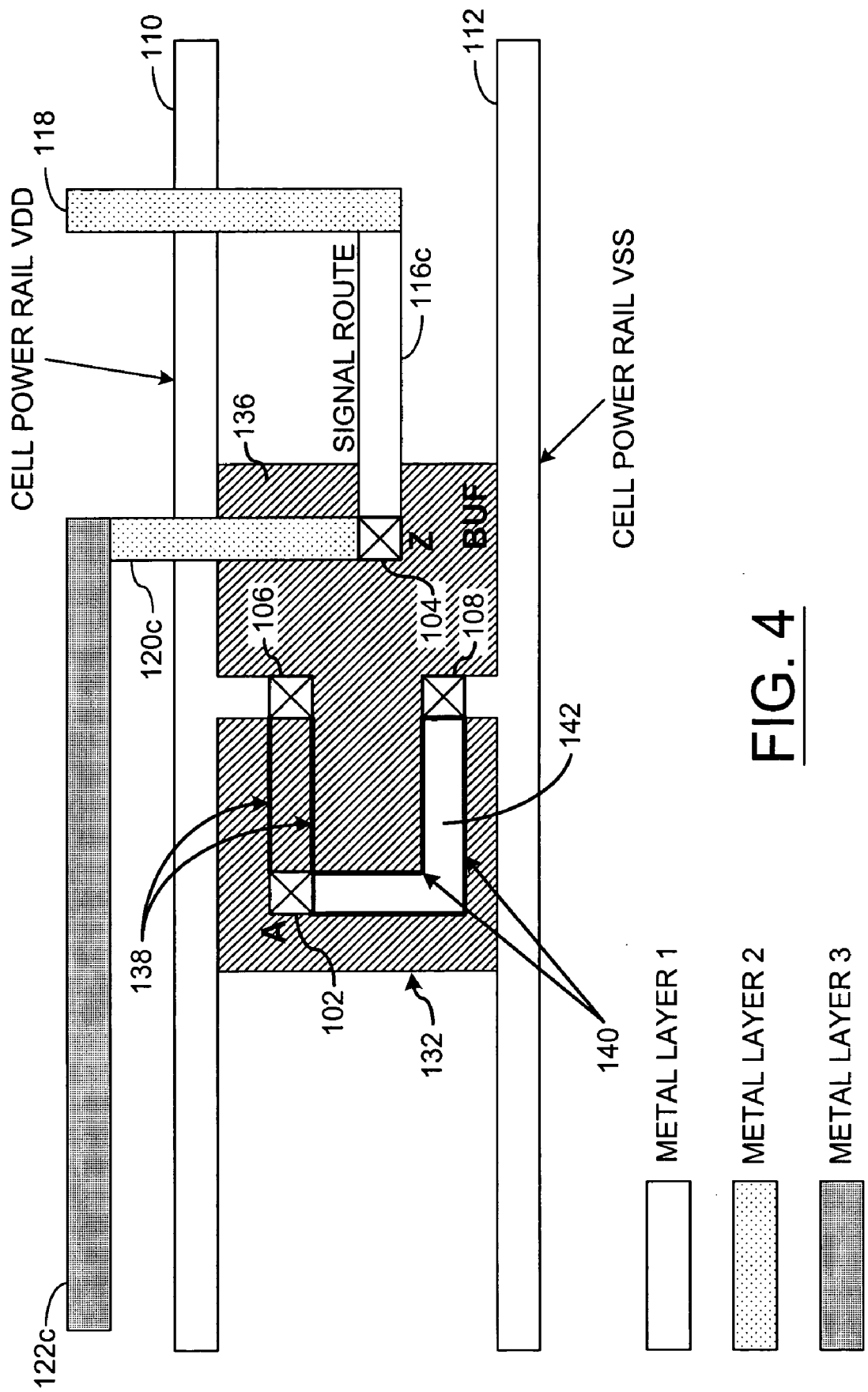
FIG. 4 is a block diagram of an example layout of another special circuit.

Referring to FIG. 4, a block diagram of an example layout of another special circuit 136 is shown. The circuit 136 may be referred to a special cell. The special cell 136 may have a same layout and functionality as the standard cell 100. The special cell 136 may be operational to generate the output signal Z in response to the input signal A (e.g., Z=f(A)). For example, the special cell 136 may implement a non-inverting buffer function (e.g., Z=1*A), same as the standard cell 100. Other functions, different number of inputs and a different number of outputs may be implemented to meet the criteria of a particular application.

The special cell 136 generally comprises the input pin 102, the output pin 104, the first power pin 106 and the second power pin 108. The special cell 136 may include one or more characteristics (or attributes) not present in the standard cell 100. The special cell 136 may include a blocking characteristic associated with the input pin 102 not found in the standard cell 100.

The blocking characteristics may include a first reserved route 138 and a second reserved route 140. The first reserved route 138 may reserve an area (or path) between the input pin 102 and the first power pin 106. The second reserved route 140 may reserve an area (or path) between the input pin 102 and the second power pin 108. The first reserved route 138 and the second reserved route 140 may be totally contained within the boundary 132 of the special cell 136. A first trace (not shown) or a second trace 142 (shown) may be used to drive the input signal A to either VDD or VSS, respectively.

The reserved routes 138 and 140 may alter how the automatic software tool implements the traces connected to the output pin 104. For example, a trace 120c may be shifted to the right of power pins 106 and 108. Therefore, a trace 116c may not extend to the left of the output pin 104, as does the trace 116a (FIG. 2). Furthermore, a trace 122c may be longer than the similar trace 122a (FIG. 2).

Figure 5:
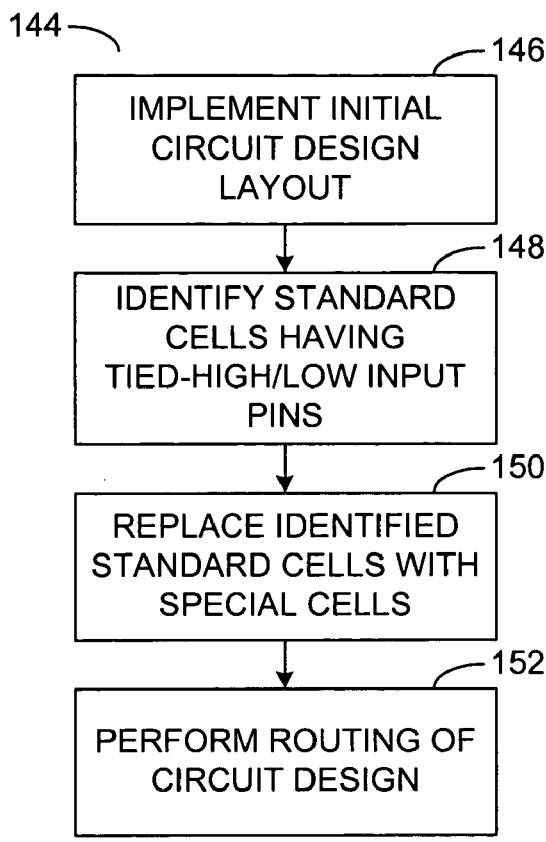
FIG. 5 is a flow diagram of an example method for implementing a circuit design using the special cells.

Referring to FIG. 5, a flow diagram of an example method 144 for implementing a circuit design using the special cells is shown. The method 144 generally begins with performing an initial layout of a circuit design (e.g., block 146). After the initial layout has been determined, standard cells having one or more input pins permanently tied either high or low may be identified through manual and/or automatic means (e.g., block 148). The standard cells with fixed input pins may then be replaced with associated special cells having the same pinouts, same functionality and the added blocking characteristics (e.g., block 150). Routing of the circuit design may then be performed with the special cells in place (e.g., block 152). The special cells generally reserve paths on a particular conductive layer between the tied-high and tied-low input pins and both the logical high power conductors and the logical low power conductors. Therefore, any subsequent swapping of a tied input pins between high and low may be easily performed by changing only the particular conductive layer carrying the power.

Figure 6:
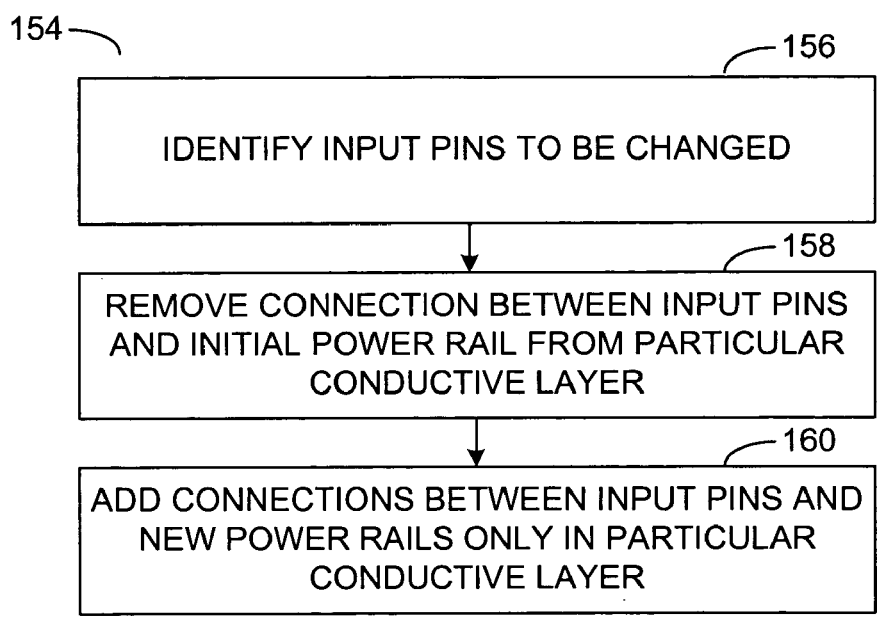
FIG. 6 is a flow diagram of an example method for swapping a tied input pin of a special cell.

Referring to FIG. 6, a flow diagram of an example method 154 for swapping a tied input pin of a special cell is shown. The method 154 generally begins by identifying one or more input pins to be changed (e.g., block 156). Each trace connecting an identified input pin to a power rail may be removed from the particular conductive layer (e.g., block 158). One or more new traces may be added to the particular conductive layer to tie each of the identified input pins to a new power rail thereby swapping the logical values received by the input pins (e.g., block 160).

The various signals of the present invention are generally "high" (e.g., a digital HIGH, on or 1) or "low" (e.g., a digital LOW, off or 0). However, the particular polarities of the "high" (e.g., asserted) and "low" (e.g., de-asserted) states of the signals may be adjusted (e.g., reversed) accordingly to meet the design criteria of a particular implementation. Additionally, inverters may be added to change a particular polarity of the signals.

The function performed by the flow diagrams of FIGS. 5 and 6 may be implemented using a conventional general purpose digital computer programmed according to the teachings of the present specification, as will be apparent to those skilled in the relevant art(s). Appropriate software coding may readily be prepared by skilled programmers based on the teachings of the present disclosure, as will also be apparent to those skilled in the relevant art (s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product that may be a storage medium including instructions that may be used to program a computer to perform a process in accordance with the present invention and/or special cell definitions. The storage medium may include, but is not limited to, any type of disk including floppy disk, optical disk, CD-ROM, magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. A method for implementing a circuit design, comprising the steps of:
   (A) identifying a first cell in a layout of said circuit design, said first cell having (i) a function and (ii) an input pin, said input pin being connectable to one of a first power rail and a second power rail, said second power rail having a different voltage than said first power rail;
   (B) replacing said first cell with a second cell, said second cell having (i) said function, (ii) said input pin and (iii) at least one blocking characteristic, said blocking characteristic reserving (a) a first route completely within a particular conductive layer of said second cell between said input pin and said first power rail and (b) a second route completely within said particular conductive layer between said input pin and said second power rail; and
   (C) routing said circuit design incorporating said second cell such that said input pin is connected to one of (i) said first power rail using said first route and (ii) said second power rail using said second route.

2. The method according to claim 1, wherein an unused one of said first route and said second route is not crossed within said particular conductive layer by any other route after said routing of said circuit design.

3. The method according to claim 1, wherein said blocking characteristic prevents any other route from intersecting said first route within said particular conductive layer.

4. The method according to claim 1, wherein said blocking characteristic prevents any route from intersecting said second route within said particular conductive layer.

5. The method according to claim 1, further comprising the step of:
   rerouting said input pin from one to another of said first power rail and said second power rail after said routing of said circuit design.

6. The method according to claim 5, wherein said rerouting impacts only said particular conductive layer.

7. The method according to claim 1, wherein said first power rail and said second power rail define a logical high voltage level and a logical low voltage level.

8. The method according to claim 1, further comprising the step of:

executing a script configured to convert said first cell into said second cell prior to said routing.

9. The method according to claim 1, wherein said routing comprises the sub-step of:
routing a third cell, said third cell being (i) similar to said first cell and (ii) void of said blocking characteristic as found in said second cell.

10. The method according to claim 1, wherein said routing comprises the sub-step of:
routing a first power pin of said second cell completely within said particular conductive layer to said first power rail.

11. A storage medium for use in a computer to develop a circuit design, said storage medium recording a circuit library that is readable by said computer, said circuit library defining a cell, said cell comprising:
an input pin for a function of said cell;
a first conductive layer; and
at least one blocking characteristic instructing said computer to reserve (i) a first route between said input pin and a first power rail and (ii) a second route between said input pin and a second power rail, said second power rail having a different voltage than said first power rail, wherein both said first route and said second route are completely within said first conductive layer.

12. The storage medium according to claim 11, said cell further comprising a first power pin routable to said first power rail completely within said first conductive layer.

13. The storage medium according to claim 12, wherein said first route spans between said input pin and said first power pin.

14. The storage medium according to claim 12, said cell further comprising a second power pin routable to said second power rail completely within said first conductive layer.

15. The storage medium according to claim 14, wherein said second route spans between said input pin and said second power pin.

16. The storage medium according to claim 11, said cell further comprising an output pin (i) driven by said function and (ii) at least partially routable within said first conductive layer outside both of said first route and said second route.

17. The storage medium according to claim 11, said cell further comprising a first location on an external boundary of said cell, wherein said first route spans between said input pin and said first location.

18. The storage medium according to claim 17, said cell further comprising a second location on said external boundary, wherein said second route spans between said input pin and said second location.

19. The storage medium according to claim 18, wherein said first location and said second location are on physically opposite sides of said cell.

20. The storage medium according to claim 11, said cell further comprising:
a second conductive layer;
an output pin (i) partially routable within said first conductive layer outside both of said first route and said second route and (ii) partially routable within said second conductive layer;
a first power pin routable to said first power rail within said first conductive layer; and
a second power pin routable to said second power rail within said first conductive layer.

21. The method according to claim 10, wherein said routing further comprises the sub-step of:
routing a second power pin of said second cell completely within said particular conductive layer to said second power rail.

22. The method according to claim 1, wherein said routing comprises the sub-step of:
routing an output pin of said second cell within said particular conductive layer and another conductive layer.

23. The method according to claim 1, further comprising a storage medium recording a computer program comprising the steps of claim 1.

* * * * *